US 6,710,286 B2

(12) United States Patent
Han

(10) Patent No.: US 6,710,286 B2
(45) Date of Patent: Mar. 23, 2004

(54) CHIP SCALE MARKER AND MAKING METHOD

(75) Inventor: You-hie Han, Daejon (KR)

(73) Assignee: EO Technics Co., Ltd. (KR)

( * ) Notice: Subject to any disclaimer, the term of this patent is extended or adjusted under 35 U.S.C. 154(b) by 0 days.

(21) Appl. No.: 10/232,746

(22) Filed: Sep. 3, 2002

(65) Prior Publication Data
US 2003/0192866 A1 Oct. 16, 2003

(30) Foreign Application Priority Data
Apr. 15, 2002 (KR) .................................. 2002-20412

(51) Int. Cl.[7] ............................................. B23K 26/20
(52) U.S. Cl. ............................ 219/121.68; 219/121.69; 219/121.81
(58) Field of Search .................... 219/121.6, 121.67, 219/121.68, 121.69, 121.72, 121.78, 121.81

(56) References Cited

U.S. PATENT DOCUMENTS 4,598,242 A * 7/1986 Hayashi et al. ............. 318/640
5,524,131 A * 6/1996 Uzawa et al. ................. 378/34
5,719,372 A * 2/1998 Togari et al. ........... 219/121.61

* cited by examiner

Primary Examiner—Samuel M. Heinrich
(74) Attorney, Agent, or Firm—Burns Doane Swecker & Mathis, LLP

(57) ABSTRACT

Provided is a chip scale marker and a marking method. The method for marking, using a chip scale marker, wherein a laser beam is irradiated from a laser source on the wafer chips via a galvano scanner and an f-theta lens, the method comprising: (a) measuring position information of a plurality of points on the wafer; (b) transmitting the measured position information to a controller; (c) calculating a deviation between a marking distance between the f-theta lens and the point on the wafer surface and a focus distance of the f-theta lens from the transmitted position information; and (d) if the deviation is greater than a predetermined value in the step (c), calibrating the wafer chip to be positioned at the focus distance of the f-theta lens. According to the chip scale marker, it is possible to increase marking quality by measuring and calibrating a vertical distance from an f-theta lens of the laser system to each wafer chip so that the wafer chip is marked at a predetermined distance from the f-theta lens of the laser system.

23 Claims, 6 Drawing Sheets

CHIP SCALE MARKER AND MAKING METHOD

BACKGROUND OF THE INVENTION

1. Field of the Invention

The present invention relates to a chip scale marker and a marking method, and more particularly, to a method for marking characters on a wafer chip after calibrating a marking distance from a laser to the wafer, using a laser of a chip scale marker and a device thereof.

2. Description of the Related Art

In general, wafers used in a semiconductor manufacturing process are composed of several thousands to several tens of thousands of chips. It is required that characters or/and numbers are marked on a surface of each chip in order to classify the chips according to their production lot numbers. Presently, a chip scale marker using a laser beam is used as a tool for marking.

FIG. 1 is a schematic view of a general chip scale marker 10, illustrated with a wafer w. Referring to FIG. 1, the wafer w is placed on a wafer holder 20 and a laser system 30 is positioned below the wafer holder 20. A laser beam oscillated from a laser source of the laser system 30, is irradiated on chips of the wafer w via a galvano scanner (not shown) and an f-theta lens (not shown), and finally marks characters on the chips.

Above the wafer holder 20, a camera 40 is positioned for monitoring an object held by the wafer holder 20. The camera 40 is connected to an X-Y stage 50 and moves with the X-Y stage 50. The reference numeral 60 denotes a table, on which the X-Y stage 50 and the wafer holder 20 are placed.

FIG. 2 is a view showing a depth of focus D.O.F of a laser beam irradiated on the wafer. FIG. 3 is a view showing a warpage of wafer on a wafer holder. Referring to FIG. 2, a laser beam to be irradiated on a horizontal wafer chip from the f-theta lens 34 via the galvano scanner (not shown). Here, it is possible to obtain good quality of marking only if a marking surface is placed in the range of the depth of focus D.O.F. Here, the depth of focus is calculated as follows.

$$D.O.F = \pm 2\lambda(f/D)^2$$

Here, D denotes the diameter of an incident beam, f denotes the focus distance and $\lambda$ is the wavelength of a laser beam.

However, in a wafer including a plurality of chips, there is a warpage in a certain direction due to weight of the wafer, coating on the wafer surface and other processes (refer to FIG. 3). This warpage becomes severer as the wafer is bigger, the wafer is thinner, and the wafer shrinks more, when the coatings on the wafer harden. If a height deviation h of wafer surface to be marked due to warpage is bigger than the depth of focus, the marking quality decreases because a beam laser density changes depending on the position of a chip on a wafer surface.

SUMMARY OF THE INVENTION

It is an object of the present invention to provide a method for measuring the wafer warpage, calibrating a marking distance, and marking a wafer.

It is another object of the present invention to provide a chip scale marker for the above marking method.

To accomplish the first object of the present invention, there is provided a method for marking, using a chip scale marker, wherein a laser beam is irradiated from a laser source on the wafer chips via a galvano scanner and an f-theta lens, the method comprising: (a) measuring position information of a plurality of points on the wafer; (b) transmitting the measured position information to a controller; (c) calculating a deviation between a marking distance between the f-theta lens and the point on the wafer surface and a focus distance of the f-theta lens from the transmitted position information; and (d) if the deviation is greater than a predetermined value in the step (c), calibrating the wafer chip to be positioned at the focus distance of the f-theta lens.

It is preferable that the step (a) is measured using a non-contact sensor, a laser sensor. Preferably, the step (a) is sequentially performed at each chip of the wafer or performed on a predetermined plurality of wafer chips positioned on at least one straight line crossing an axis of the wafer. It is preferable that the step (c) further comprises calculating a marking height deviation between the maximum and the minimum of the deviations. It is preferable that the step (d) comprises: (d1) equally dividing the marking height deviation into a predetermined number n, and forming the divided n regions at a marking surface of the wafer by forming contour lines with the equally divided height deviation; (d2) adjusting the wafer chips of a selected region at a predetermined distance from the f-theta lens; (d3) marking wafer chips of the selected region; and (d4) repeating steps (d2) and (d3).

The length of the equally divided height deviation may be smaller than a depth of focus of the f-theta lens, preferably is smaller than ½ of the depth of focus of the f-theta lens.

To accomplish another object of the present invention, there is provided a chip scale marker that includes a laser system for marking a wafer, a wafer holder for supporting a wafer to be processed, and a camera which moves while being connected to an X-Y stage over the wafer holder and monitors an object held by the wafer holder, the chip scale marker further comprising: a sensor for measuring a vertical position of each chip of the wafer; and a means for moving the wafer holder in a vertical direction. It is preferable that the sensor is connected to the X-Y stage.

To accomplish the second object of the present invention, there is provided a chip scale marker, further comprising a means for moving the laser system for wafer marking in a vertical direction, instead of a means for vertical moving of the wafer holder.

In addition, to achieve the second object of the present invention, there is provided a chip scale marker, further comprising; a focus distance correction lens located between the laser oscillator and the galvano scanner; and a means for moving the focus distance correction lens in a horizontal direction.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
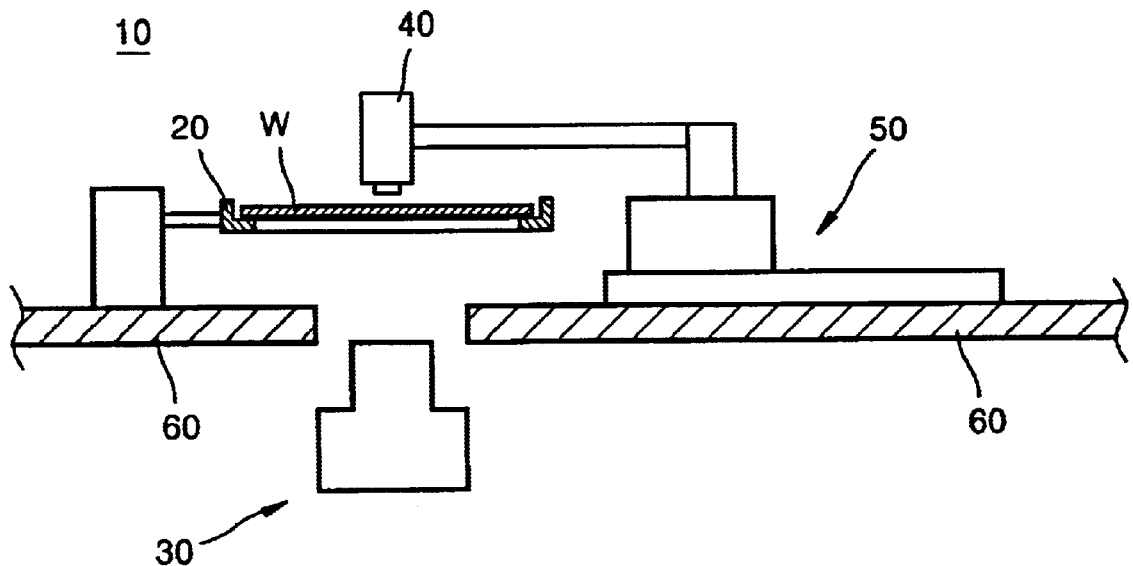
FIG. 1 is a schematic view of a general chip scale marker.
Figure 2:
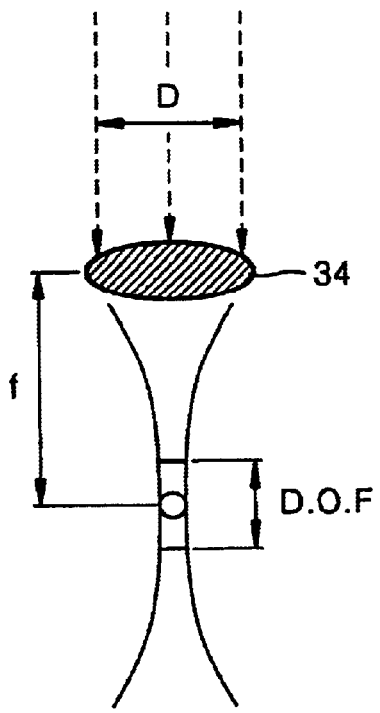
FIG. 2 is view showing a depth of focus of a laser beam to be irradiated on a wafer.
Figure 3:
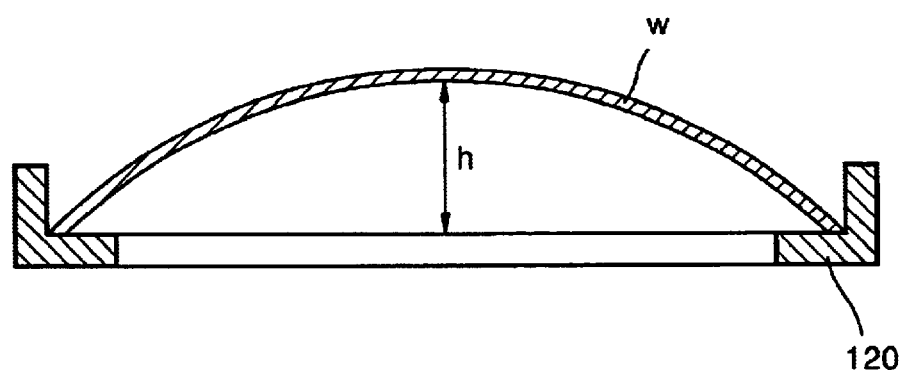
FIG. 3 is a view showing a warpage of a wafer on a wafer holder.

The present invention will now be described more fully with reference to the accompanying drawings in which preferred embodiments of the invention, a device for correcting a marking distance of a chip scale marker, are shown. In the drawings, the thickness of layers and regions are exaggerated for clarity.

Figure 4:
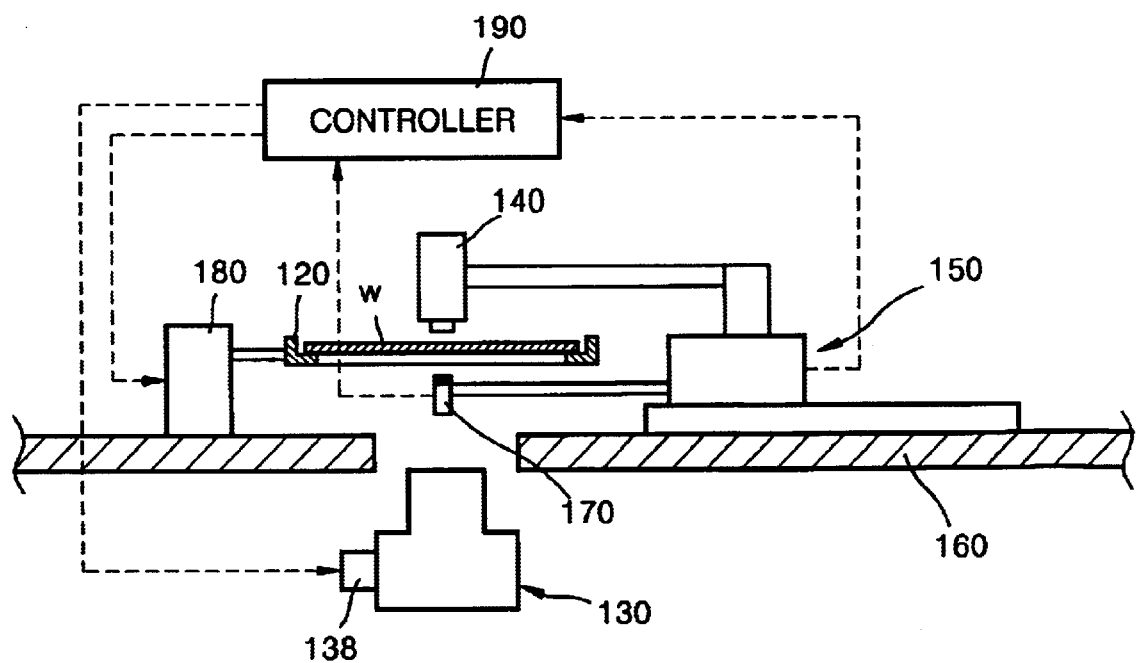
FIG. 4 is a schematic view of a chip scale marker according to a preferred embodiment of the present invention.
Figure 5:
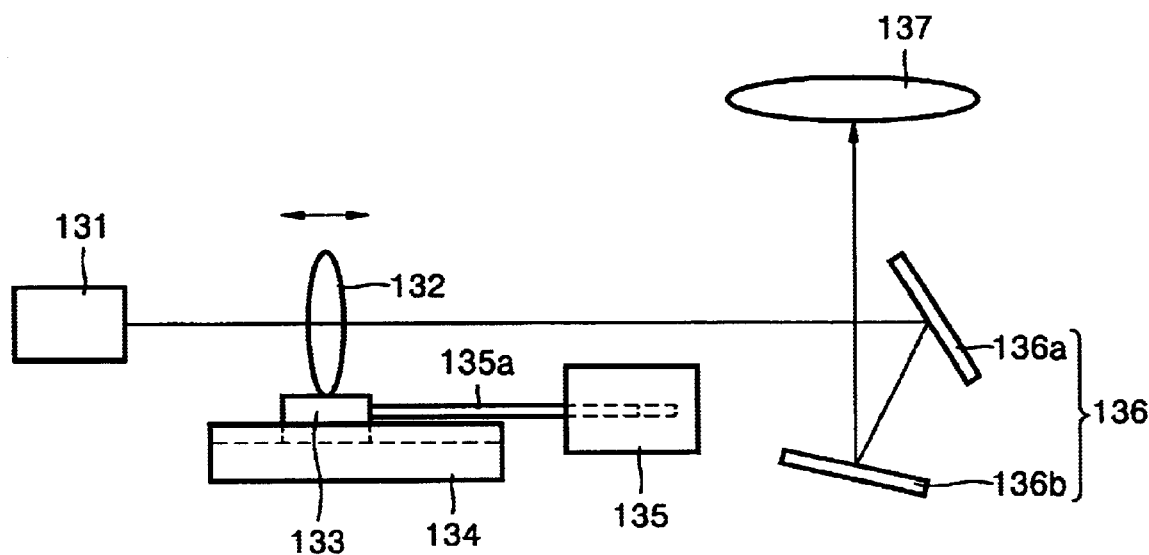
FIG. 5 is a schematic configuration view of the laser system of FIG. 4.

FIG. 4 is a schematic view of a chip scale marker according to an embodiment of the present invention, and FIG. 5 is a view showing a schematic configuration of a laser system of FIG. 4.

Referring to FIGS. 4 and 5, a vertical moving device 180 and an X-Y stage 150 are placed on the table 160. The wafer holder 120 is connected to a side of the vertical moving device 180 in a horizontal direction. A wafer w is placed on the wafer holder 120 and a laser system 130 is positioned below the wafer holder 120. The laser system 130 includes a laser source 131 for providing a laser beam, and a focus distance correction lens 132, a galvano scanner 136, and an f-theta lens 137 sequentially placed on a laser path from the laser oscillator 131.

The galvano scanner 136, which includes an X-mirror 136a, a Y-mirror 136b and a motor (not shown) for driving the X-mirror and the Y-mirror, controls positions of the mirrors 136a and 136b and scans the laser beam on a predetermined region in a X-Y direction.

The f-theta lens 137 makes it possible that an incident laser beam forms a same sized focus distance in an entire region of a marking region. There are a focus distance correction lens 132 for controlling a focus distance of a laser beam incident on the f-theta lens from the laser source 131 and a moving means for moving the lens 132 on the laser beam path in a horizontal direction, between the laser source 131 and the galvano scanner 136.

The moving means includes a fixing means 133 for fixing the focus distance correction lens 132, a linear guide 134 for guiding the fixing means in a horizontal direction, and an actuator 135 which is connected to the fixing means 133 with an end of a stroke pipe 135a and moves the fixing means 133 on the linear guide 134 in a horizontal direction.

The focus distance correction lens 132 is a convex lens for focusing an incident laser beam. If the lens 132 moves toward the galvano lens 136, a focus distance, for focusing the laser beam passing through the f-theta lens 137, increases. If the lens 132 moves toward the laser source 131, a focus distance, for focusing the laser beam passing through the f-theta lens 137 decreases.

The laser beam from the laser source 131 is irradiated on the chip of the wafer w through the two mirrors 136a, 136b, and the f-theta lens 137, and finally marks characters on the chips. In addition, the reference numeral 138 denotes a vertical moving device which is positioned at a side of the laser system 130 and moves the laser system 130 in a vertical direction.

A camera is positioned above the wafer holder 120 to monitor an object held by the wafer holder. The camera 140 is connected to an X-Y stage 150 and moves with the X-Y stage 150. In addition, a non-contact type laser sensor 170 is connected to a side of the X-Y stage 150. The laser sensor 170 moves horizontally under a wafer holder 120 and measures the warpage of the wafer w on the wafer holder 120. In addition, a controller 190 is placed to control the functions of the chip scale marker. The controller 190 receives position information of the laser sensor 170 from the X-Y stage 150 and the vertical moving device 180, and a vertical distance information between each chip of the wafer and the laser sensor 170 from the laser sensor 170. It is possible that the controller 190 keeps regular marking distances between the f-theta lens 137 and the wafer chips by driving the vertical moving devices 138 and 180 according to outputs of the controller 190 when marking with a laser. The controller 190 positions the wafer chips at the focus distance formed by the f-theta lens 137 by driving the actuator 135.

Figure 6:
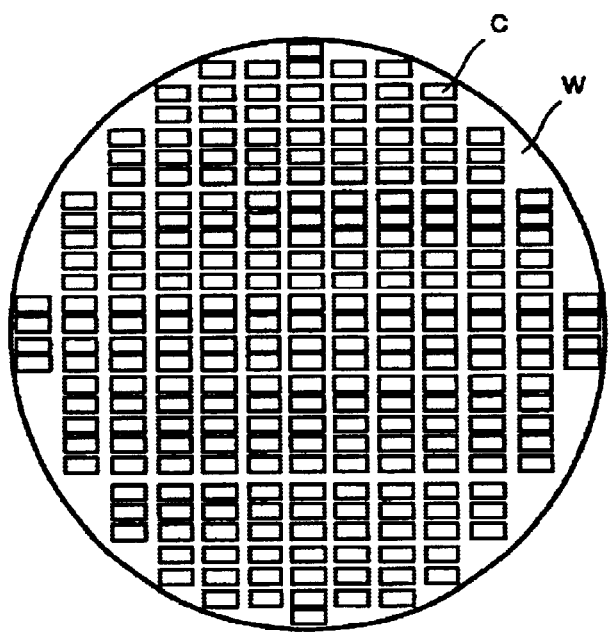
FIG. 6 is a schematic plane view of a plurality of chips formed at a wafer.

FIG. 6 is a schematic plane view showing a plurality of chips at a wafer. Each chip has an area less than 1 mm² exaggerated for clarity in the drawings. Referring to FIG. 6, chips c manufactured by the semiconductor process are formed in parallel with each other at the wafer w.

Figure 7:
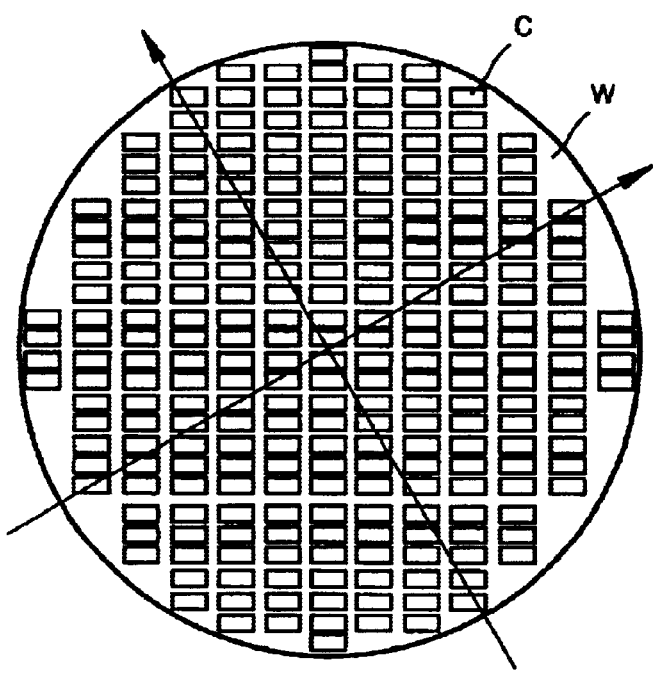
FIG. 7 is a plane view schematically showing a method for measuring a warpage of a wafer.
Figure 8:
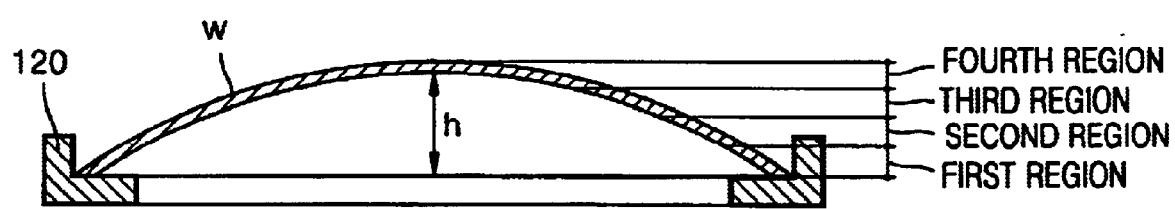
FIG. 8 is a plane view schematically showing a method for dividing a wafer surface for marking.
Figure 9:
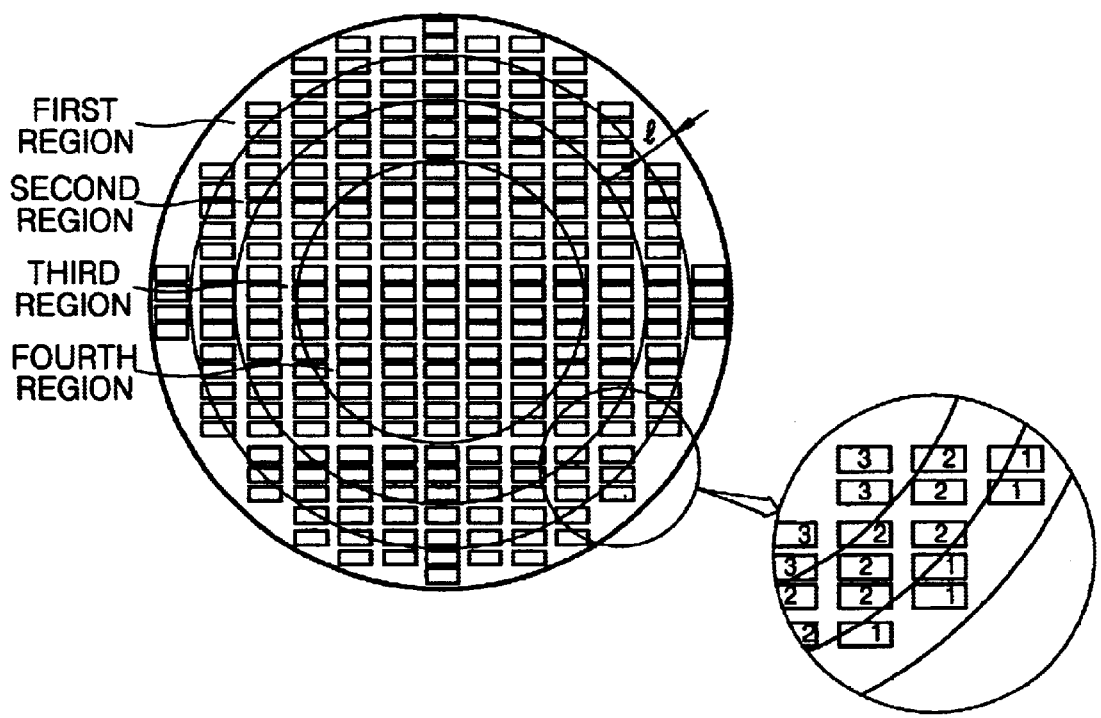
FIG. 9 is a schematic plane view of the wafer of FIG. 8.

FIG. 7 is a schematic plane view showing a method for measuring a warpage of a wafer, FIG. 8 is a plane view schematically showing a method for dividing a wafer surface for marking, and FIG. 9 is a schematic plane view of the wafer of FIG. 8. Referring to FIGS. 7 through 9, the laser sensor 170, which is moved by the X-Y stage 150 in a linear direction across the center of the wafer w, measures the vertical distance from the laser sensor 170 to the surface of the wafer 2. At this time, a plane position (X,Y) of the measured chip is measured from the X-Y stage 150 and the vertical position Z is measured by the laser sensor 170. Then, the measured data is transmitted to the controller 190. The measurement and the transmission are performed at a predetermined plurality of points on at least one line.

After the measurement and transmission is completed, a vertical height deviation h of the marking surface is obtained. The deviation is obtained from the difference between the maximum and the minimum of the measured vertical lengths (refer to FIG. 8). If the height deviation h is greater than a predetermined value, for example, a depth of focus of the f-theta lens, the height deviation h is divided by a number n so that the divided height is less than the depth of focus. It is preferable that a divided distance is set to be less than ½ of the depth of focus to reflect an error occurring at a wafer chip which is located at both divided regions.

Then, the wafer chips c are divided into n regions on the marking surface according to the division of the height deviation. Here, a line for dividing neighboring regions is a contour line from the divided height deviation. FIGS. 8 and 9 show an example of dividing the wafer chips into four regions.

As shown in FIG. 9, if a wafer chip c covers two regions, it is classified to a region to which larger area of the wafer chip belong. If both areas of the wafer chip at two regions of the wafer are almost the same, the wafer chip is arbitrarily classified to one of the two regions. In the enlarged view of FIG. 9, wafer chips covering two regions are classified to the regions they belong by the region numbers. It is preferable that a minimun distance l at radial direction of each region is set to be greater than a length of the wafer chip.

Next, marking by regions is performed. If wafer chips in the first region are firstly marked, after the wafer chips of the first region 120 are adjusted to be placed within an appropriate marking distance by the vertical moving device 180, the wafer chips of the first region 120 is marked. Next, the wafer holder 120 and the wafer w are moved downward to a predetermined height by the vertical moving device 180 and each chip of the second region is marked. As described above, marking by regions is performed by adjusting the positions of the wafer.

In addition, the marking by regions may be performed using a vertical moving device 138 of a laser system 130 instead of the vertical moving device 180 of the wafer holder. The marking process using the vertical moving device 180 will now be described in detail. If the first region is firstly marked, a laser system 130 is moved by the vertical moving device 138 so that the wafer chips at the first region on the wafer holder 120 are positioned within a predetermined marking distance from the f-theta lens 137. Then, marking is performed at the first region. Next, the f-theta lens 137 is moved upward to a predetermined height by the vertical moving device 138. Then, marking is performed in the second region. As described above, marking by regions is performed by adjusting the f-theta lens 137.

In addition, marking by regions may be performed by adjusting the focus distance correction lens 132 using the actuator 135. The marking process using the focus distance correction lens 132 will now be described in detail. In case that the first region is marked, the position of the focus distance correction lens 132 is adjusted using the actuator 135 so that the focus of the f-theta lens 137 is positioned on the wafer chips of the first region on the wafer holder 120. Then, marking is performed at the first region. Next, the actuator 135 moves the focus distance correction lens 132 toward the galvano scanner 136 with a predetermined distance to increase the focus distance of the f-theta lens 137. Then, marking on each chip is performed in the second region.

Figure 10:
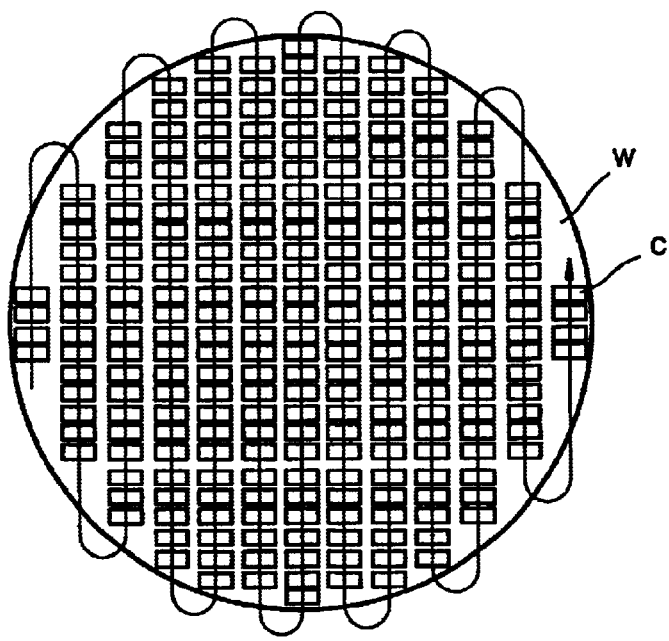
FIG. 10 is a view schematically showing another method for measuring a warpage of a wafer.

FIG. 10 is a schematic view to show another method for measuring a warpage of a wafer. Referring to FIG. 10, the laser sensor 170 is moved under the position of each chip in zigzags by the X-Y stage 150, measures the vertical distance from the laser sensor 170 to the surface of each chip c, and transmits the measured distance to the controller 190. The plane position (X,Y) of the measured chip is measured from the X-Y stage 150 and a vertical position Z is measured from the laser sensor 170. Thereafter, the measured data is transmitted to the controller 190.

After the measurement and transmission is completed, a vertical height deviation h (in FIG. 8) of the marking surface is obtained. If the height deviation h is greater than a predetermined value, for example, a depth of focus of the f-theta lens 137, the height deviation is divided by the number n so that the divided height is less than the depth of focus.

Then, marking is performed on wafer chips. For example, the wafer chips in the front region are marked in a predetermined marking distance. Next, neighboring chip is marked. If this chip belongs to different region, a marking distance between the marking region of the wafer w and the f-theta lens 137 is adjusted by the vertical moving distance 138 or 180, and marking on this wafer chip c is performed.

As described above, marking by wafer chips is performed by adjusting the position of the wafer.

In addition, marking can be performed by adjusting the focus distance correction lens 132 in a horizontal position, depending on marking regions to which a wafer chip to be marked belongs.

Figure 11:
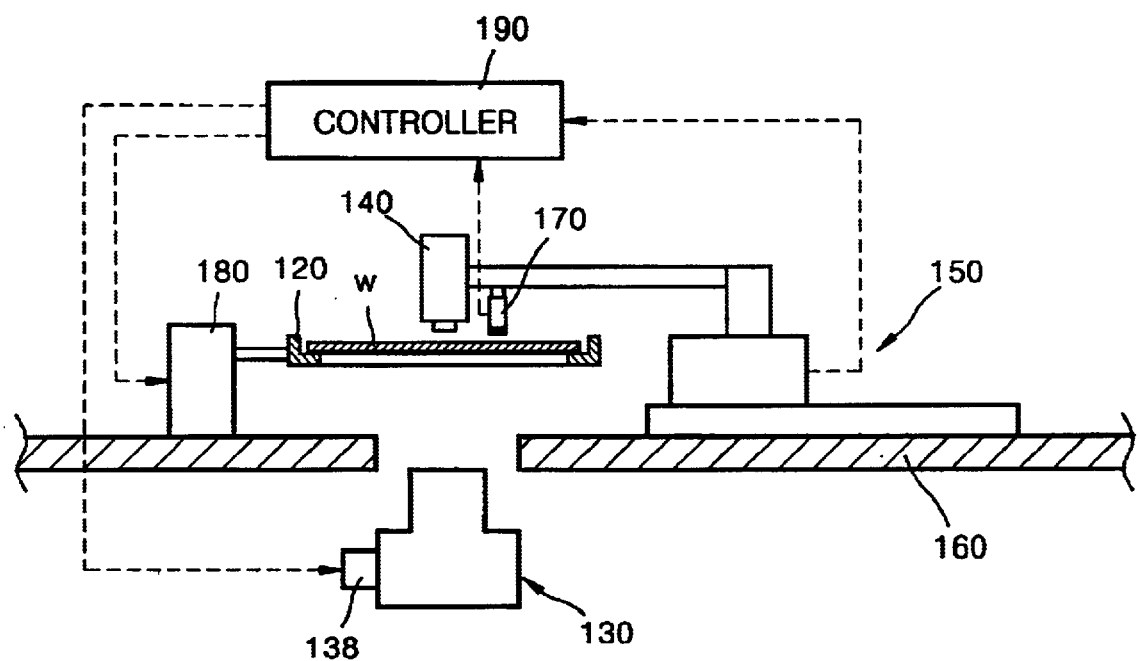
FIG. 11 is a schematic view of a chip scale marker showing another embodiment of the chip scale marker of FIG. 4.

FIG. 11 is an another embodiment of the present invention, the same reference numerals in different drawings represent the same element, and thus their description will be omitted. Referring to FIG. 11, the laser sensor 170 is connected to the X-Y stage 150 and arranged over the wafer holder 120. Other compositions and operations are the same as the preferred embodiments, thus descriptions in detail is omitted.

As described above, according to the chip scale marker and the marking method of the present invention, a vertical distance from the f-theta lens of the laser system to each wafer chip is measured and calibrated before marking so that the wafer chip is marked at a predetermined distance from the f-theta lens of the laser system. Thus, marking quality increases.

It is noted that the present invention is not limited to the preferred embodiment described above, and it is apparent that variations and modifications can be made by those skilled in the art within the spirit and scope of the present invention defined in the appended claims and equivalents thereof.

What is claimed is:

1. A method for marking, using a chip scale marker, wherein a laser beam is irradiated from a laser source on the wafer chips via a galvano scanner and an f-theta lens, the method comprising:
   (a) measuring position information of a plurality of points on the wafer;
   (b) transmitting the measured position information to a controller;
   (c) calculating a deviation between a marking distance between the f-theta lens and the point on the wafer surface and a focus distance of the f-theta lens from the transmitted position information; and
   (d) if the deviation is greater than a predetermined value in the step (c), calibrating the wafer chip to be positioned at the focus distance of the f-theta lens.

2. The method of claim 1, wherein the step (a) measures a vertical distance between a wafer surface and a non-contact sensor using the non-contact sensor.

3. The method of claim 2, wherein the non-contact sensor is a laser sensor.

4. The method of claim 1, wherein the step (a) is sequentially performed at each chip of the wafer.

5. The method of claim 1, wherein the step (a) is performed on a predetermined plurality of wafer chips positioned on at least one straight line crossing an axis of the wafer.

6. The method of claim 1, wherein the step (c) further comprises calculating a marking height deviation between the maximum and the minimum of the deviations.

7. The method of claim 6, wherein the step (d) comprises:
   (d1) equally dividing the marking height deviation into a predetermined number n, and forming the divided n regions at a marking surface of the wafer by forming contour lines with the equally divided height deviation;
   (d2) adjusting the wafer chips of a selected region at a predetermined distance from the f-theta lens;
   (d3) marking wafer chips of the selected region; and
   (d4) repeating steps (d2) and (d3).

8. The method of claim 7, wherein in step (d2) a vertical position of the wafer holder is adjusted.

9. The method of claim 7, wherein in step (d2) a vertical position of the f-theta lens is adjusted.

10. The method of claim 7, wherein in step (d2) a focus distance of the f-theta lens is adjusted by modifying a horizontal position of a correction lens for a focus distance between the laser source and the galvano scanner.

11. The method of claim 7, wherein the length of the equally divided height deviation is smaller than a depth of focus of the f-theta lens.

12. The method of claim 7, wherein the length of the equally divided height deviation is smaller than ½ of the depth of focus of the f-theta lens.

13. The method of claim 7, wherein a minimum distance of each region at radial direction in the marking surface is larger than a length of the wafer chip.

14. The method of claim 7, wherein the wafer chip on the contour line is classified to a region to which larger area of the wafer chip belong.

15. A chip scale marker that includes a laser system for marking a wafer, a wafer holder for supporting a wafer to be processed, and a camera which moves while being connected to an X-Y stage over the wafer holder and monitors an object held by the wafer holder, the chip scale marker further comprising:

a sensor for measuring a vertical position of each chip of the wafer; and a means for moving the wafer holder in a vertical direction.

16. The chip scale marker of claim 15, wherein the sensor is a laser sensor.

17. The chip scale marker of claim 15, wherein the sensor is connected to the X-Y stage.

18. A chip scale marker that includes a laser system for marking a wafer, a wafer holder for supporting a wafer to be processed and a camera which moves while being connected to an X-Y stage over the wafer holder, and monitors an object held by the wafer holder, the chip scale marker further comprising:

a sensor for measuring a vertical position of each chip of the wafer; and a means for moving the laser system for the wafer marking in a vertical direction.

19. The chip scale marker of claim 18, wherein the sensor is a laser sensor.

20. The chip scale marker of claim 18, wherein the sensor is connected to the X-Y stage.

21. A chip scale marker that includes a laser system for marking a wafer by irradiating a laser beam from a laser oscillator via a galvano scanner and an f-theta lens on the wafer to be marked, a wafer holder for supporting a wafer to be marked and a camera which moves while being connected to an X-Y stage over the wafer holder and monitors an object held by the wafer holder, the chip scale marker further comprising:

a sensor for measuring the vertical position of each chip on the wafer;

a focus distance correction lens located between the laser oscillator and the galvano scanner; and a means for moving the focus distance correction lens in a horizontal direction.

22. The chip scale marker of claim 21, wherein the sensor is a laser sensor.

23. The chip scale marker of claim 21, wherein the sensor is connected to the X-Y stage.

* * * * *